(12) United States Patent
Seo et al.

(10) Patent No.: US 7,358,126 B2
(45) Date of Patent: Apr. 15, 2008

(54) DUAL DAMASCENE STRUCTURE AND METHODS OF FORMING THE SAME

(75) Inventors: Jun Seo, Gyeonggi-do (KR);
Jong-Hyuk Kim, Gyeonggi-do (KR);
Jong-Heui Song, Gyeonggi-do (KR);
Yung-Jun Kim, Gyeonggi-do (KR);
Min-Chul Chae, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 19 days.

(21) Appl. No.: 11/333,110

(22) Filed: Jan. 17, 2006

(65) Prior Publication Data

US 2006/0163738 A1    Jul. 27, 2006

(30) Foreign Application Priority Data

Jan. 21, 2005   (KR)   ...................... 10-2005-0005712

(51) Int. Cl.
*H01L 23/43*   (2006.01)
*H01L 21/4763*   (2006.01)

(52) U.S. Cl. .................. 438/150; 438/288; 438/197; 438/481; 257/E33.005

(58) Field of Classification Search ............... 438/150, 438/288, 197, 481, E33.005
See application file for complete search history.

(56) References Cited

U.S. PATENT DOCUMENTS 5,554,870 A   9/1996   Fitch et al. ................. 257/334
5,731,217 A   3/1998   Kadosh et al. ................. 437/41
2006/0057825 A1*   3/2006   Bude et al. ................. 438/481

FOREIGN PATENT DOCUMENTS

JP   05-136060   6/1993

* cited by examiner

*Primary Examiner*—Steven Loke
*Assistant Examiner*—Tony Tran
(74) *Attorney, Agent, or Firm*—Myers Bigel Sibley & Sajovec, PA

(57) ABSTRACT

A dual damascene structure and a method of forming a dual damascene structure are disclosed. The dual damascene structure includes an insulation member, a single crystal member and a filling member. The insulation member has an opening having a dual damascene shape. The filling member is formed on a side face of the opening. The single crystal member contacts the filling member. The single crystal member fills up the opening. In order to form a dual damascene structure, an insulating member having an opening partially filled with a preliminary single crystal member is formed. The filling member is formed on a side face of the opening. The preliminary single crystal member epitaxially grows to fill up the opening. Because the filling member is positioned between the single crystal member and the insulation member, void formation may be reduced between the single crystal member and the insulation member.

21 Claims, 12 Drawing Sheets

DUAL DAMASCENE STRUCTURE AND METHODS OF FORMING THE SAME

CROSS REFERENCE TO RELATED APPLICATION

This application claims priority under 35 USC § 119 to Korean Patent Application No. 10-2005-0005712 filed on Jan. 21, 2005, the disclosure of which is incorporated herein by reference in its entirety.

FIELD OF THE INVENTION

The present invention relates to a dual damascene structure, and methods of forming a dual damascene structure. More particularly, the present invention relates to a dual damascene epitaxial structure, and methods of forming a dual damascene epitaxial structure.

BACKGROUND

In general, solid material may exist in an amorphous state, a polycrystalline state, and/or a single crystalline state.

Because atoms included in a material having an amorphous state are irregularly arranged, a material having an amorphous state may not be electrically conductive.

A material having a polycrystalline state may have crystal structures of various sizes, shapes, and/or orientations. Within the crystal structures, atoms may be arranged in an orderly fashion. However, there are grain boundaries between the crystal structures that may inhibit the movement of carriers, such as electrons and/or holes, in the material. As a result, the electrical characteristics of a polycrystalline material may be relatively poor.

A material having a single crystalline state has a crystal structure of one type, where atoms are arranged in an orderly pattern in the crystal structure. Thus, a material having a single crystal structure may not have a large number of grain boundaries therein. As a result, the electrical characteristics of a material having a single crystalline state may be substantially superior to those of a material having a polycrystalline state.

Accordingly, a semiconductor device having a multi-layered structure, such as a thin film transistor (TFT) or a system on chip (SOC), may generally include at least one single crystalline member.

However, when a single crystalline member is grown epitaxially, a void or voids may be formed between the single crystalline member and an insulation member that is adjacent to the single crystalline member.

In addition, when a single crystalline member is grown epitaxially, a void or voids may be formed between adjacent single crystalline members.

SUMMARY

Some embodiments of the present invention may provide a dual damascene structure having reduced voids between an insulation member and a single crystal member.

Some embodiments of the invention may also provide a dual damascene structure having reduced voids between an insulation member and single crystal members, and/or between the single crystal members.

Some embodiments of the invention may provide methods of forming a dual damascene structure capable of reducing voids between an insulation member and a single crystal member.

Some further embodiments of the invention may provide methods of forming a dual damascene structure capable of reducing voids between an insulation member and single crystal members and/or between the single crystal members.

In accordance with some embodiments of the present invention, a dual damascene structure may include an insulation member, a filling member, a single crystal member and a single crystal member. The insulation member may be formed on a single crystal seed layer. The insulation member may include a first opening and a second opening. The first opening may partially expose the single crystal seed layer therethrough. The second opening may be communicated with the first opening. The second opening may be substantially wider than the first opening. The filling member may be formed on a side face of the second opening. The filling member may partially fill up the second opening. The single crystal member may continuously fill up the first opening and the second opening. The single crystal member may contact the filling member.

In accordance with further embodiments of the present invention, a dual damascene structure includes an insulation member, a filling member, single crystal members and a single crystal connection member. The insulation member may be formed on a single crystal seed layer. The insulation member may include first openings and a second opening. The first openings may partially expose the single crystal seed layer. The second opening may be communicated with the first openings. The second opening may be substantially wider than the first openings. The filling member may be formed on a side face of the second opening. The filling member may partially fill up the second opening. The single crystal members may continuously fill up the first opening and the second opening. The single crystal connection member may be connected between the single crystal members. The single crystal connection member may have a single crystalline state changed from an amorphous state.

In accordance with further embodiments of the present invention, there are provided methods of forming a dual damascene structure as follows. A preliminary dual damascene structure is formed. The preliminary dual damascene structure may include an insulation member and a preliminary single crystal member. The insulation member may be formed on a single crystal seed layer. The insulation member may include a first opening and a second opening. The first opening may partially expose the single crystal seed layer therethrough. The second opening may be communicated with the first opening. The second opening may be substantially wider than the first opening. The preliminary single crystal member may contact the single crystal seed layer. The preliminary single crystal member may substantially fill up the first opening. Thereafter, a filling member may be formed on a side face of the second opening. The filling member may partially fill up the second opening. Thereafter, a single crystal member may be formed by causing the preliminary single crystal member to grow epitaxially. The single crystal member may continuously fill up the first opening and the second opening. The single crystal member may contact the filling member.

In accordance with further embodiments of the present invention, there are provided methods of forming a dual damascene structure as follows.

A preliminary dual damascene structure including an insulation member and preliminary single crystal members is formed. The insulation member may be formed on a single crystal seed layer. The insulation member may include first openings and a second opening. The first openings may partially expose the single crystal seed layer. The second opening may be communicated with the first openings. The second opening may be substantially wider than the first openings. The preliminary single crystal members may contact the single crystal seed layer. The preliminary single crystal members may substantially fill up the first openings. Subsequently, a filling member may be formed on a side face of the second opening. The filling member may partially fill up the second opening. The single crystal members may be formed by causing the preliminary single crystal members to grow epitaxially. The single crystal members may contact the filling member. The single crystal members may continuously fill up the first openings and the second opening. Thereafter a single crystal connection member connected between the single crystal members may be formed. The single crystal connection member may have a single crystalline state changed from an amorphous state.

According to some embodiments of the present invention, a filling member may be formed between an epitaxially grown single crystal member and an insulation member. Thus, the formation of voids between the single crystal member and the insulation member may be reduced.

In addition, a single crystal connection member may be formed between the single crystal members. Thus, the formation of voids between the single crystal members may be reduced.

BRIEF DESCRIPTION OF THE DRAWINGS

The above and other advantages of the present invention will become readily apparent by reference to the following detailed description when considered in conjunction with the accompanying drawings in which.

DETAILED DESCRIPTION OF EMBODIMENTS OF THE INVENTION

Figure 1:
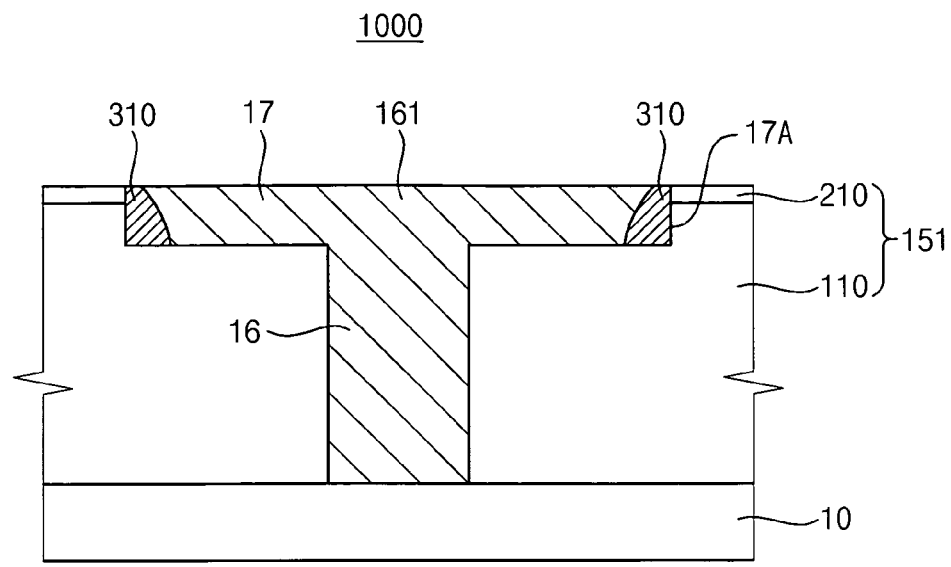
FIG. 1 is a cross-sectional view illustrating a dual damascene channel structure in accordance with an some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Various embodiments of the present invention will now be described with reference to the accompanying drawings.

FIG. 1 is a cross-sectional view illustrating a dual damascene channel structure in accordance with some embodiments of the present invention.

Referring to FIG. 1, a dual damascene channel structure 1000 includes an insulation member 151, a single crystal member 161 and a filling member 310.

The insulation member 151 is formed on a single crystal seed layer 10. The insulation member 151 has a first opening 16 and a second opening 17. The first opening 16 partially exposes the single crystal seed layer 10 therethrough. The second opening 17 is communicated with the first opening 16. The width of the second opening 17 is substantially larger than that of the first opening 16. That is, the insulation member 151 may have a dual damascene shape.

The single crystal seed layer 10 may include silicon.

The single crystal seed layer 10 may be a silicon substrate, a silicon-on-insulator substrate, and/or an epitaxial layer that is epitaxially grown from a single crystal silicon layer. The insulation member 151 may include an oxide. The oxide may be boro-phosphor silicate glass (BPSG), phosphor silicate glass (PSG), undoped silicate glass (USG), spin on glass (SOG), plasma enhanced-tetraethylorthosilicate (PE-TEOS) and/or high density plasma-chemical vapor deposition (HDP-CVD) oxide. These may be used alone or in a mixture thereof.

The insulation member 151 may include at least one insulation layer pattern. For example, the insulation member 151 may include a first insulation pattern 110 and a second insulation pattern 210.

The filling member 310 is formed on a side face 17A of the second opening to partially fill up the second opening 17.

A lower portion of the filling member 310 may be substantially wider than an upper portion of the filling member 310.

The filling member 310 may include a nitride. The nitride may include silicon oxynitride (SiON) and/or silicon nitride (SiN). These may be used alone or in a mixture thereof.

The single crystal member 161 may continuously fill up the first opening 16 and the second opening 17. The single crystal member 161 may contact the filling member 310.

The single crystal member 161 may be epitaxially grown from the single crystal seed layer 10. Thus, the single crystal member 161 may include the same material as the single crystal seed layer 10. That is, the single crystal member 161 may include silicon.

Although it is not particularly illustrated in the drawings, a semiconductor structure, such as a gate electrode and a metal wire, may be formed on the single crystal member 161.

Alternatively, at least two dual damascene channel structures 1000 may be stacked to form a semiconductor device having a multi-layered structure.

As described above, the filling member 310 is formed between the insulation member 151 and the single crystal member 161. Thus, the formation of voids between the insulation member 151 and the single crystal member 161 may be reduced.

Hereinafter, methods of manufacturing a dual damascene structure 1000 according to some embodiments will be described.

FIGS. 2 to 11 are cross-sectional views illustrating methods of forming a dual damascene channel structure as illustrated in FIG. 1.

Figure 2:
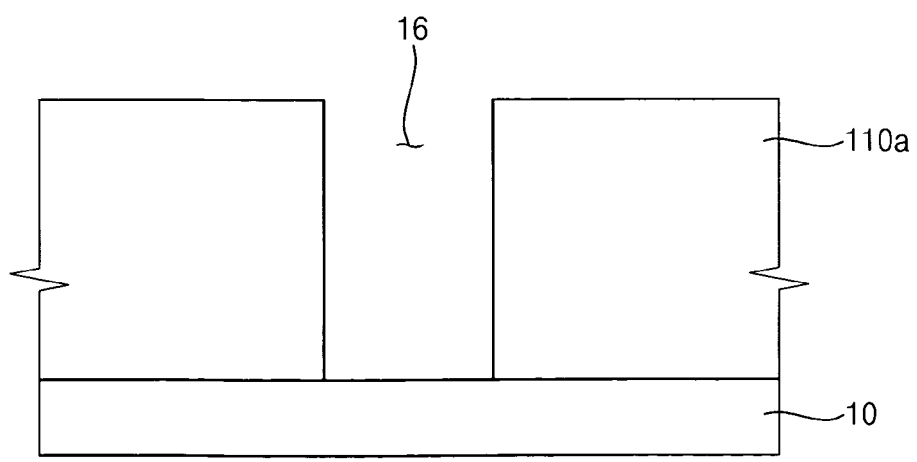
FIGS. 2 to 11 are cross-sectional views illustrating methods of manufacturing a dual damascene channel structure according to some embodiments of the present invention.

Referring to FIG. 2, a first preliminary insulation layer pattern 110a is formed on a single crystal seed layer 10. The first preliminary insulation layer pattern 110a has a first opening 16 partially exposing the single crystal seed layer 10 therethrough.

The single crystal seed layer 10 may include silicon.

The first preliminary insulation layer pattern 110a may include an oxide. The oxide may include BPSG, PSG, USG, SOG, PE-TEOS and/or HDP-CVD oxide. These may be used alone or in a mixture thereof.

Figure 3:
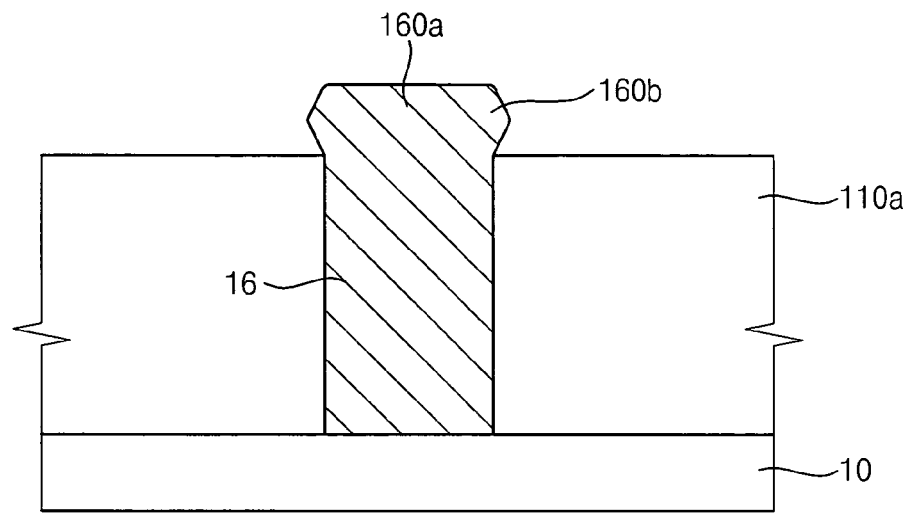

Referring to FIG. 3, a preliminary epitaxial member 160a is epitaxially grown from the single crystal seed layer 10. The preliminary epitaxial member 160a may fill the first opening 16. The preliminary epitaxial member 160a may have a protrusion 160b positioned over the first preliminary insulation layer pattern 110a.

The preliminary epitaxial member 160a may be formed using a silicon source gas. Examples of the silicon source gas may include silicon tetrachloride ($SiCl_4$), silane ($SiH_4$), dichlorosilane ($SiH_2Cl_2$) and/or trichlorosilane ($SiHCl_3$). These may be used alone or in a mixture thereof.

If the temperature at which the preliminary epitaxial member 160a is formed is under about 750° C., the epitaxial growth rate of the preliminary epitaxial member 160a may be low. If the temperature is over about 1,250° C., the epitaxial growth rate may be uncontrollable.

Thus, the preliminary epitaxial member 160a may be formed at a temperature between about 750° C. and about 1,250° C. Preferably, the preliminary epitaxial member 160a may be formed at a temperature between about 800° C. and 900° C.

Figure 4:
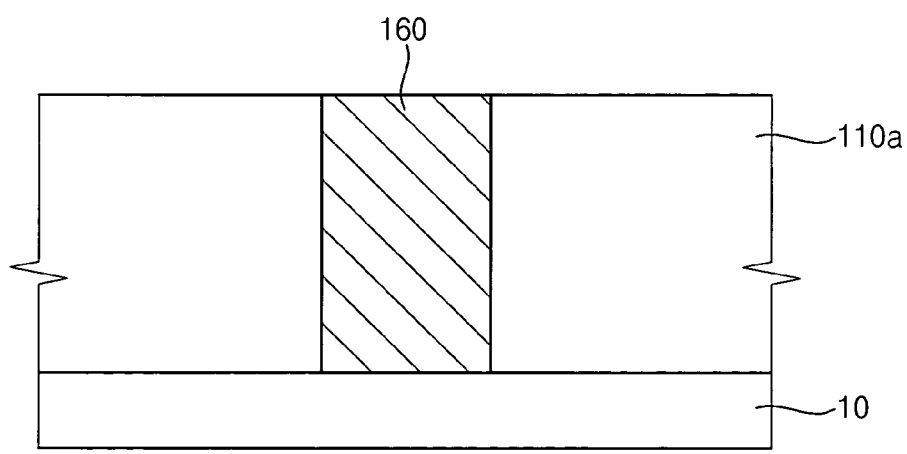

Referring to FIG. 4, any protrusion 160b of the preliminary epitaxial member 160a above the surface of the first preliminary insulation layer pattern 110a is removed to form an epitaxial member 160.

The protrusion 160b may be removed, for example, by a chemical mechanical polishing process and/or an etch-back process. These may be used alone or in a combination thereof.

Figure 5:
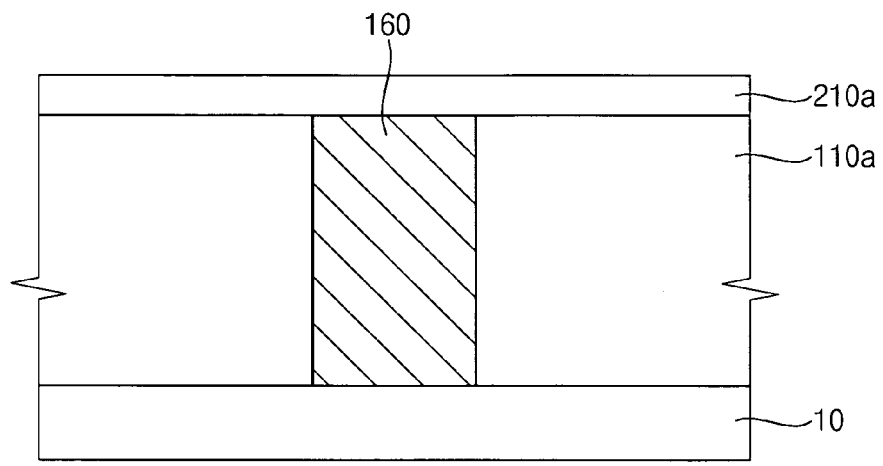

Referring to FIG. 5, a second insulation layer 210a may be formed on the first preliminary insulation layer pattern 110a and the epitaxial member 160.

The second insulation layer 210a may include an oxide. The oxide may be substantially similar to that included in the first preliminary insulation layer pattern 110a. That is, the oxide may be BPSG, PSG, PSG, USG, SOG, PE-TEOS and/or HDP-CVD oxide. These may be used alone or in a mixture thereof.

Figure 6:
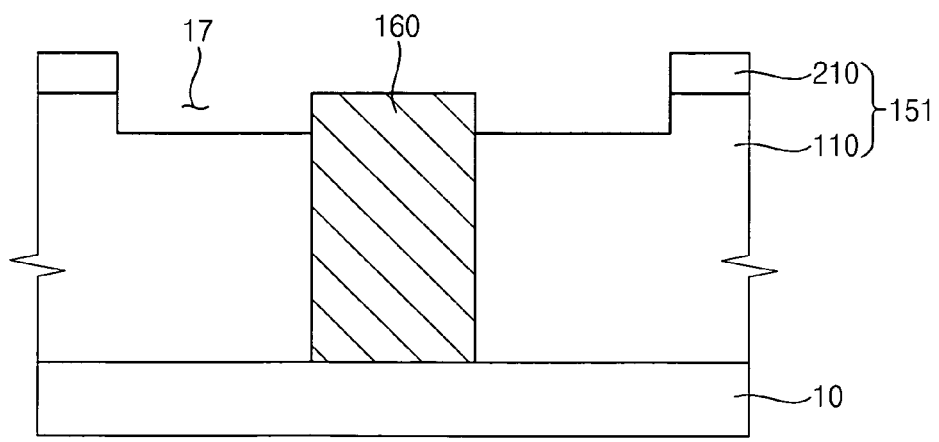

Referring to FIG. 6, portions of the first preliminary insulation layer pattern 110a and the second insulation layer 210a may be selectively removed until the epitaxial member 160 is partially protruded, so that the first insulation layer pattern 110 and the second insulation layer pattern 210 are formed.

Thus, the insulation member 151 including the first insulation layer pattern 110 and the second insulation layer pattern 210 is formed on the single crystal seed layer 10. The insulation member 151 has a first opening 16 and a second opening 17 therein. The first opening 16 partially exposes the single crystal seed layer 10 therethrough. The second opening 17 is communicated with the first opening 16. The width of the second opening 17 is substantially larger than that of the first opening 16. That is, the insulation member 151 has a dual damascene shape formed therein.

Figure 7:
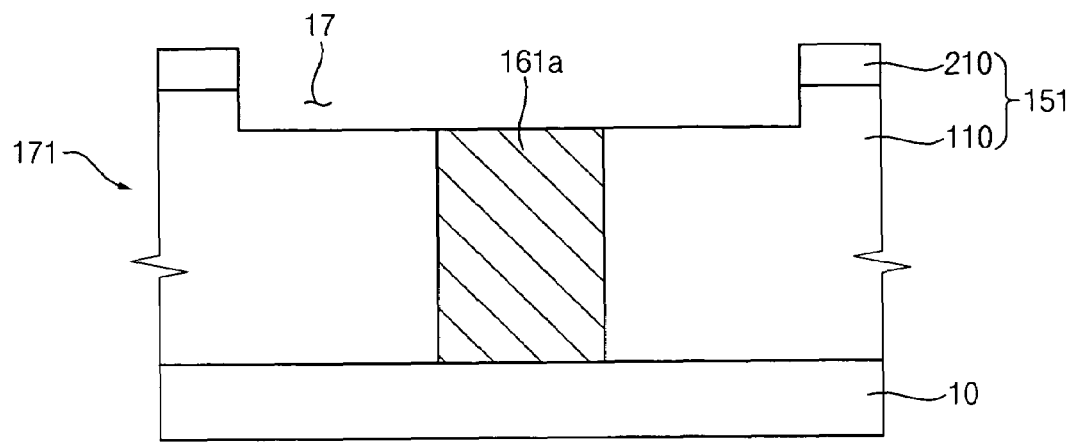

Referring to FIG. 7, the portion of the epitaxial member 160 protruded from a bottom face of the second opening 17 is removed to form a preliminary single crystal member 161a.

The protruding portion of the epitaxial member 160 may be removed, for example, by a dry etching process.

Thus, a preliminary dual damascene channel structure 171 including the insulation member 151 and the preliminary single crystal member 161a is formed.

Figure 8:
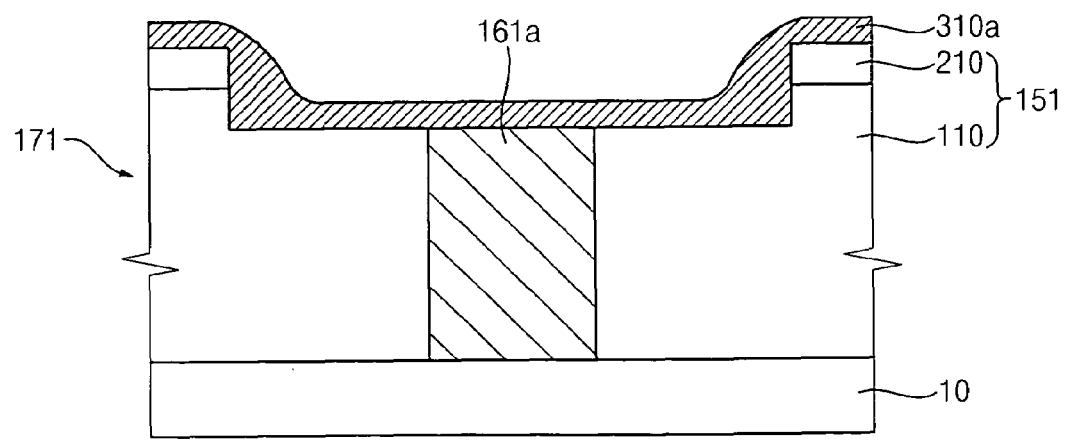

Referring to FIG. 8, a third insulation layer 310a is formed on the preliminary dual damascene channel structure 171.

The third insulation layer 310a may include a nitride. The nitride may include silicon oxynitride and/or silicon nitride. These may be used alone or in a mixture thereof.

The nitride may enable a single crystal member 161 that is epitaxially grown from the preliminary single crystal member 161a to efficiently make contact with a filling member 310 that may be formed by anisotropically etching the third insulation later 310a.

Figure 9:
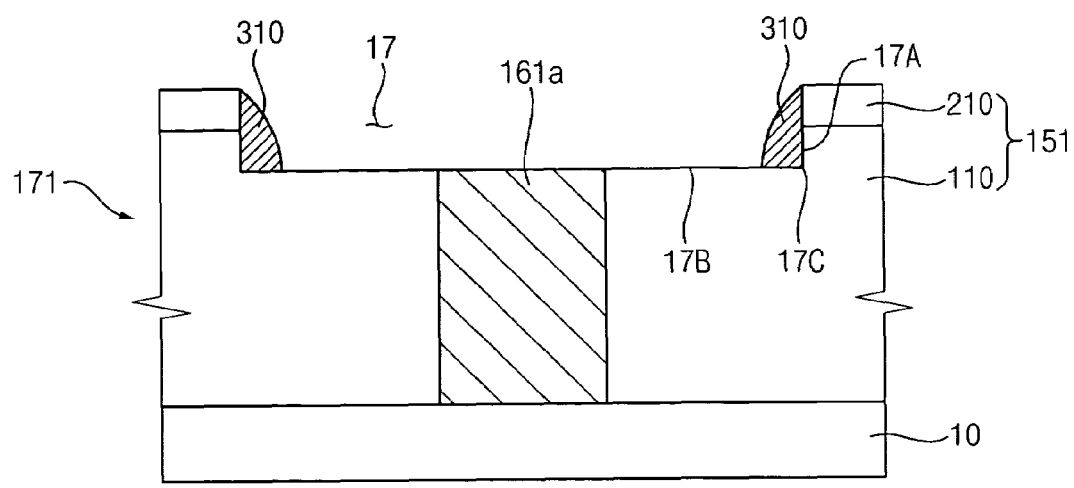

Referring to FIG. 9, the third insulation layer 310a is anisotropically etched to form the filling member 310 on the side face 17A of the second opening 17.

The lower portion of the filling member 310 near the floor 17B of the second opening 17 is substantially wider than the upper portion of the filling member 310. Thus, the filling member 310 may efficiently suppress and/or reduce voids that may otherwise occur near the corners 17C and/or sidewalls 17A of the second opening 17.

Figure 10:
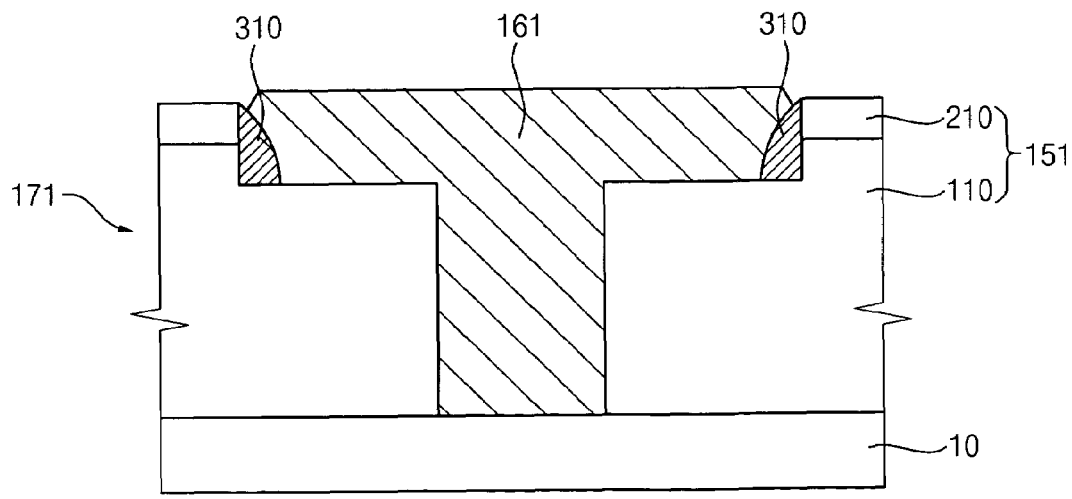

Referring to FIG. 10, the preliminary single crystal member 161a is epitaxially grown to form the single crystal member 161.

The single crystal member 161 may continuously fill up the first opening 16 and the second opening 17. In addition, the single crystal member 161 may contact the filling member 310.

The single crystal member 161 may be formed, for example, using a silicon source gas. The source gas may include silicon tetrachloride, silane, dichlorosilane and/or trichlorosilane. These may be used alone or in a mixture thereof.

If the temperature at which the single crystal member 161 is formed is under about 750° C., the epitaxial growth rate of the preliminary single crystal member 161a may be low. If the temperature is over 1,250° C., the epitaxial growth rate may be uncontrollable.

Thus, the single crystal member 161 may be formed at a temperature of about between 750° C. and about 1,250° C. Preferably, the single crystal member 161 may be formed at a temperature between about 800° C. and about 900° C.

Figure 11:
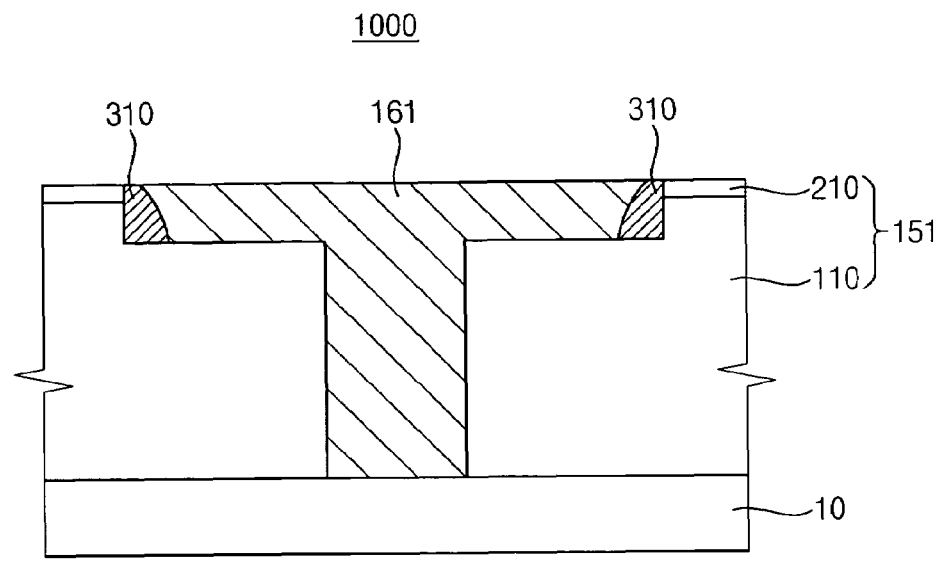

Referring to FIG. 11, the single crystal member 161, the filling member 310 and the insulation member 151 may be planarized to form the dual damascene channel structure 1000.

The single crystal member 161, the filling member 310 and the insulation member 151 may be planarized, for example, by a chemical mechanical polishing process and/or an etch-back process. These may be used alone or in a combination thereof.

Although it is not illustrated in the drawings, a semiconductor structure, such as a gate electrode or a metal wire, may be formed on the single crystal member 161.

In addition, operations illustrated In FIGS. 2 to 11 may be repeatedly performed to stack at least two dual damascene channel structures 1000.

Figure 12:
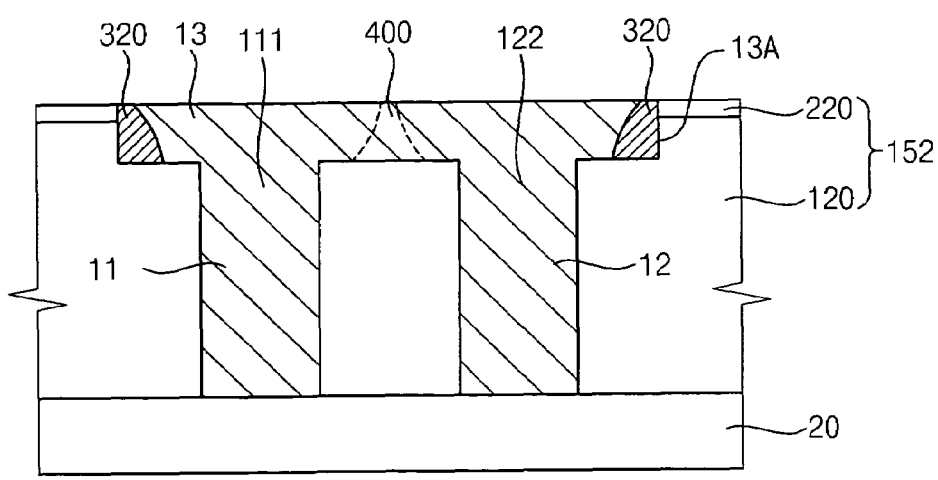
FIG. 12 is a cross-sectional view illustrating a dual damascene channel structure in accordance with some embodiments of the present invention.

FIG. 12 is a cross-sectional view illustrating a dual damascene channel structure 2000 in accordance with further embodiments of the present invention.

Referring to FIG. 12, a dual damascene channel structure 2000 includes an insulation member 152, a first single crystal member 111, a second single crystal member 122, a filling member 320 and a single crystal connection member 400.

The insulation member 152 is formed on a single crystal seed layer 20. The insulation member 152 includes a plurality of first openings 11,12 and a second opening 13. The first openings 11, 12 partially expose the single crystal seed layer 20 therethrough. The second opening is communicated with the first openings 11, 12. The second opening 13 has a width substantially wider than that of the first opening 11. That is, the insulation member 152 has a dual damascene shape.

The single crystal seed layer 20 may include silicon.

The single crystal seed layer 20 may include a silicon substrate, a silicon-on-insulator substrate and/or an epitaxial layer epitaxially grown from a single crystal silicon layer.

The insulation member 152 may include an oxide. The oxide may be BPSG, PSG, PSG, USG, SOG, PE-TEOS and/or HDP-CVD oxide. These may be used alone or in a mixture thereof.

The insulation member 152 may include at least one insulation layer pattern. For example, the insulation member 152 may include a first insulation layer pattern 120 and a second insulation layer pattern 220.

The filling member 320 is formed on a side face 13A of the second opening 13 to partially fill up the second opening 13.

A lower portion of the filling member 320 near a bottom surface 13B of the second opening 13 may be substantially wider than an upper portion of the filling member 320.

The filling member 320 may include a nitride. The nitride may include silicon oxynitride and/or silicon nitride. These may be used alone or in a mixture thereof.

The first and second single crystal members 111 and 122 may continuously fill up the first openings and the second opening. The first and second single crystal members 111 and 122 may make contact with the filling member 320. The first and the second single crystal members 111 and 122 may be spaced apart from each other.

The first and second single crystal members 111 and 122 are epitaxially grown from the single crystal seed layer 20. Thus, the first and second single crystal members 111 and 122 may include the same material as the single crystal seed layer 20. That is, the first and second single crystal members 111 and 122 may include silicon.

A single crystal connection member 400 is connected between the first single crystal member 111 and the second single crystal member 122.

The single crystal connection member 400 may include substantially the same material as in the first and second single crystal members 111 and 122. That is, the single crystal connection member 400 may include silicon.

The single crystal connection member 400 may be in a single crystalline state. In particular, the single crystal connection member 400 may be changed to a single crystal state from an amorphous state. The state of the single crystal connection member 400 may be changed by a thermal treatment.

As discussed in greater detail below, the state of the single crystal connection member 400 is changed into a single crystalline state using the first and second single crystal members 111 and 122 together as a seed. Thus, there may be substantially no gaps between the single crystal connection member 400 and the first single crystal member 111, and between the single crystal connection member 400 and the second single crystal member 122.

Although it is not illustrated in the drawings, a semiconductor structure, such as a gate electrode or a metal wire, may be formed on the first single crystal member 111, the second single crystal member 122 and the single crystal connection member 400.

In addition, at least two dual damascene channel structures 2000 may be stacked to form a semiconductor device having a multi-layered structure.

As described above, the filling member 320 is formed between the insulation member 152 and the first single crystal member 111, and between the insulation member 152 and the second single crystal member 122. In addition, the single crystal connection member 400 is formed between the first single crystal member 111 and the second crystal member 122.

Thus, the dual damascene channel structure 2000 including the filling member 320 and the single crystal connection member 400 may have a reduced number of voids therein.

Hereinafter, methods of manufacturing the dual damascene structure 2000 will be described.

FIGS. 13 to 24 are cross-sectional views illustrating methods of forming the dual damascene channel structure 2000 shown in FIG. 12.

Figure 13:
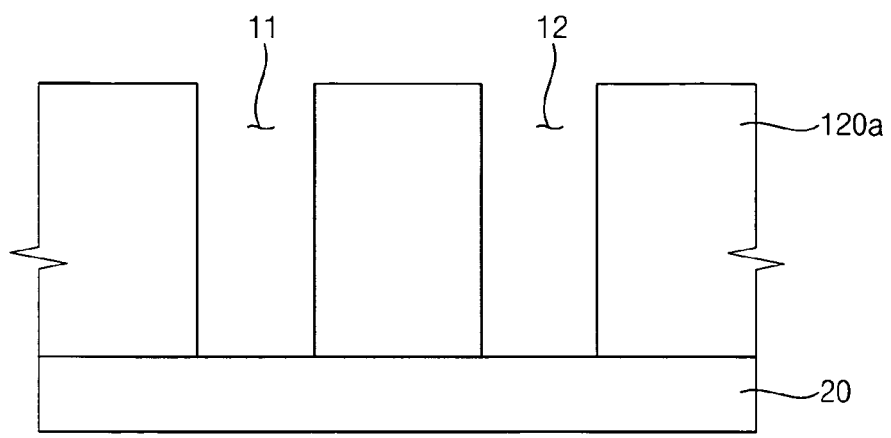
FIGS. 13 to 24 are cross-sectional views illustrating methods of manufacturing dual damascene channel structures according to some embodiments of the present invention.

Referring to FIG. 13, a first preliminary insulation layer pattern 120a is formed on the single crystal seed layer 20. The first preliminary insulation layer pattern 120a has a first opening 11 and a second opening 12 therein. The first opening 11 and the second opening 12 partially expose the single crystal seed layer 20 therethrough.

The single crystal seed layer 20 may include silicon.

The first preliminary insulation layer pattern 120a may include an oxide. The oxide may be BPSG, PSG, USG, SOG, PE-TEOS and/or HDP-CVD oxide. These may be used alone or in a mixture thereof.

Figure 14:
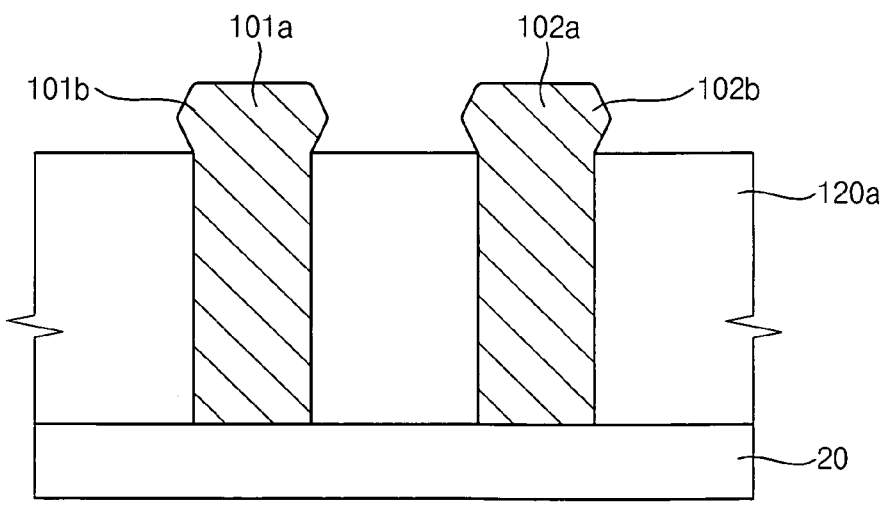

Referring to FIG. 14, preliminary epitaxial members 101a and 102a are epitaxially grown from the single crystal seed layer 20. The preliminary epitaxial members 101a and 102b may fill up the first and second openings 11 and 12. The preliminary epitaxial members 101a and 102a may have protrusions 101b, 102b that extend above the first preliminary insulation layer pattern 120a.

The first and second preliminary epitaxial members 101a and 102a may be formed, for example, using a silicon source gas. The silicon source gas may include silicon tetrachloride, silane, dichlorosilane and/or trichlorosilane. These may be used alone or in a mixture thereof.

If the temperature at which the first and second preliminary epitaxial members 101a and 102a are formed is under about 750° C., the epitaxial growth rate of the first and second preliminary epitaxial members 101a and 102a may be low. If the temperature is over about 1,250° C., the epitaxial growth rate may be uncontrollable.

Thus, the first and second preliminary epitaxial members 101a and 102a may be formed at a temperature between about 750° C. and about 1,250° C. Preferably, the first and second preliminary epitaxial members 101a and 102a may be formed at a temperature between about 800° C. and 900° C.

Figure 15:
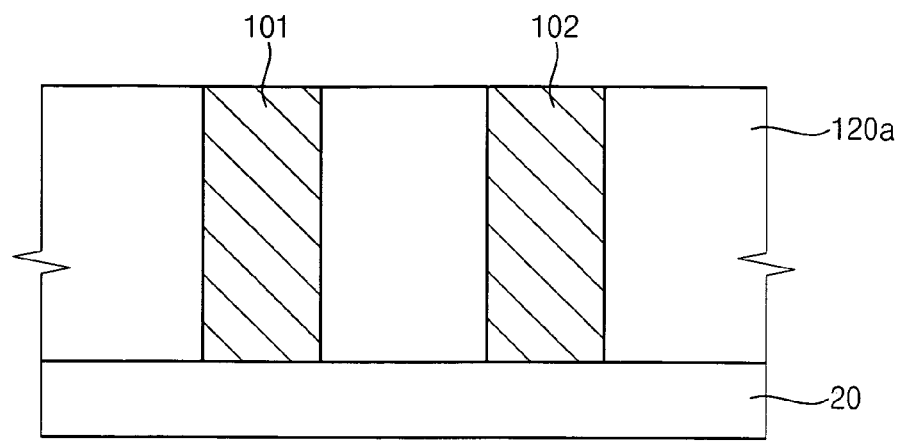

Referring to FIG. 15, the protrusions 101b, 102b of the first and second preliminary epitaxial members 101a and 102a are removed to form first and second epitaxial members 101 and 102.

The protrusions 101b, 102b may be removed, for example, by a chemical mechanical polishing process and/or an etch-back process. These may be used alone or in a combination thereof.

Figure 16:
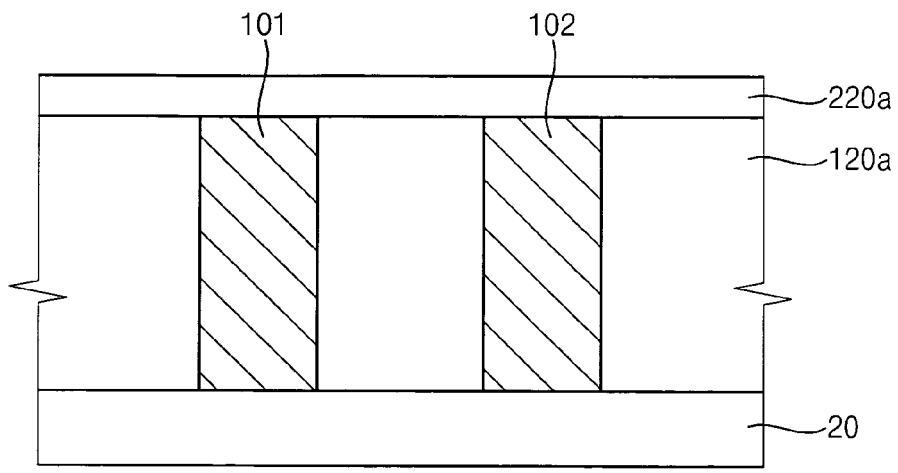

Referring to FIG. 16, a second insulation layer 220a is formed on the first preliminary insulation layer pattern 120a, the first epitaxial member 101 and the second epitaxial member 102.

The second insulation layer 220a may include an oxide. The oxide may be substantially the same as that included in the first preliminary insulation layer pattern 120a. That is, the oxide may include BPSG, PSG, USG, SOG, PE-TEOS and/or HDP-CVD oxide. These may be used alone or in a mixture thereof.

Figure 17:
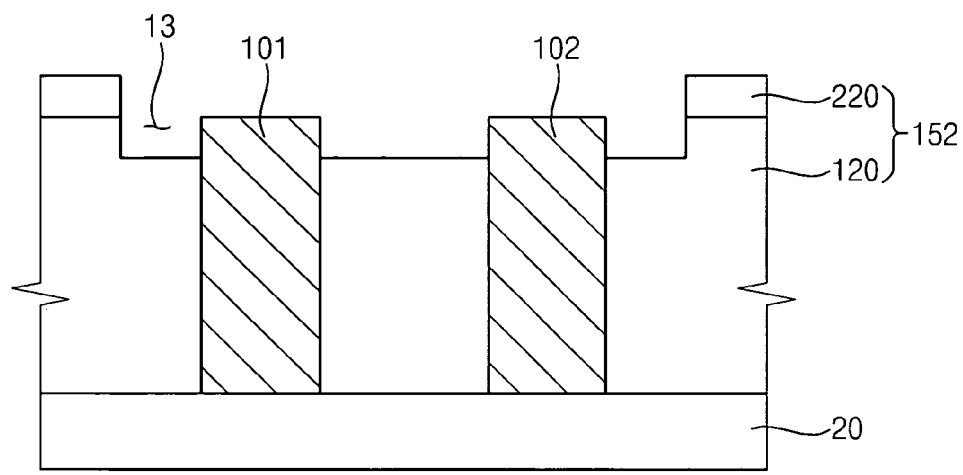

Referring to FIG. 17, portion of the first preliminary insulation layer pattern 120a and the second insulation layer 220a are removed until the first and second epitaxial members 101 and 102 are partially protruded, thereby to form first and second insulation layer patterns 120 and 220.

Thus, an insulation member 152 including the first and second insulation patterns 120 and 220 may be formed on the single crystal seed layer 20.

The insulation member 152 includes the first and second openings 11 and 12. The insulation member 152 also has a third opening 13. The first and second openings 11 and 12 partially expose the single crystal seed layer 20 therethrough. The third opening 13 is communicated with the first and second openings 11 and 12. A width of the third opening 13 is substantially larger than widths of the first and second openings 11 and 12. That is, the insulation member 152 has a dual damascene shape.

Figure 18:
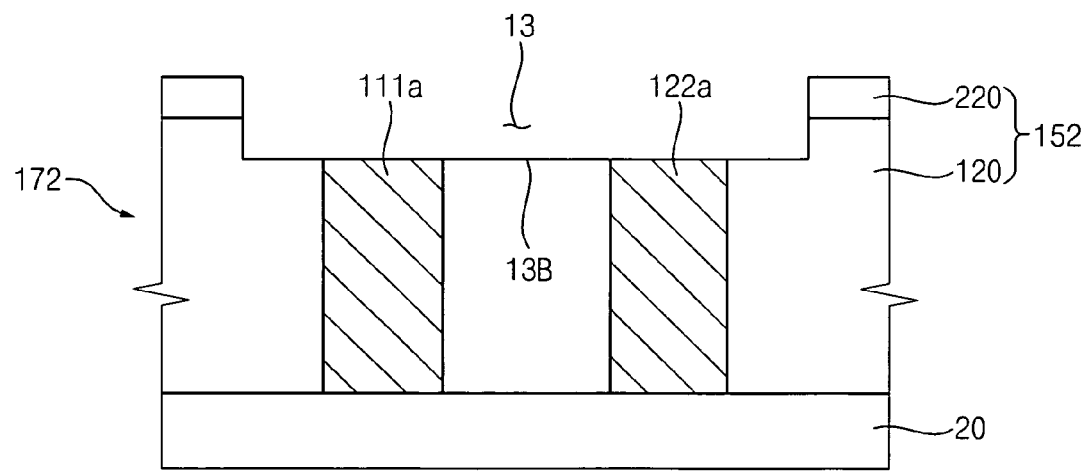

Referring to FIG. 18, protrusions of the first and second epitaxial members 101 and 102, that extend above a bottom face 13B of the third opening 13, are removed to form first and second preliminary single crystal members 111a and 122a.

The protrusions may be removed, for example, by a dry etching process.

Thus, a preliminary dual damascene channel structure 172 including the insulation member 152, the first preliminary single crystal member 111a and the second preliminary single crystal member 122a is formed.

Figure 19:
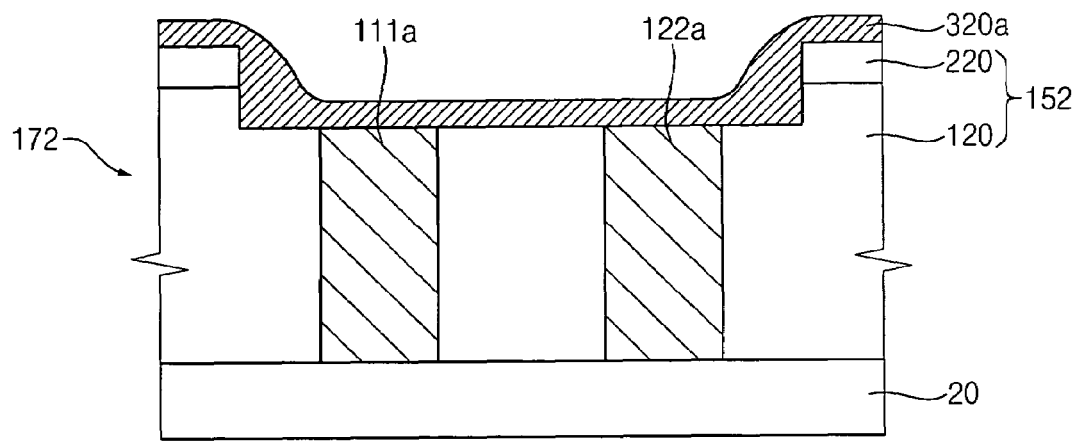

Referring to FIG. 19, a third insulation layer 320a is formed on the preliminary dual damascene channel structure 172.

The third insulation layer 320a may include a nitride. The nitride may include silicon oxynitride and/or silicon nitride. These may be used alone or in a mixture thereof.

The nitride may enable first and second single crystal members 111 and 122 that are epitaxially grown from the first preliminary single crystal member 111a and the second preliminary single crystal member 122a, respectively, to efficiently make contact with a filling member 320 that is formed by anisotropically etching the third insulation later 320a.

Figure 20:
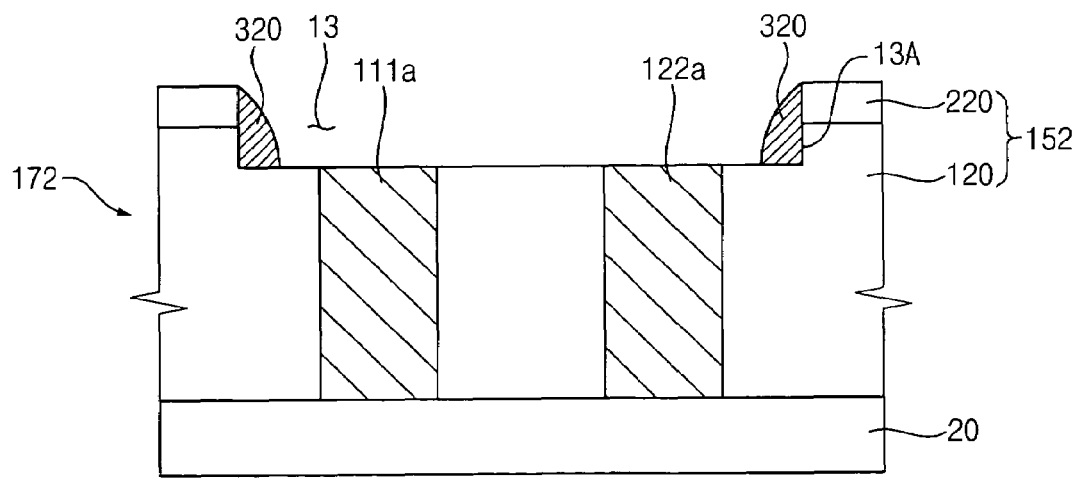

Referring to FIG. 20, the third insulation layer 320a is anisotropically etched to form the filling member 320 on a side face 13A of the third opening 13.

The lower portion of the filling member 320 may be substantially wider than the upper portion of the filing member 320. Thus, the filling member 320 may efficiently reduce the number of voids that may be otherwise formed between the filing member 320 and the side face 13A of the third opening 13.

Figure 21:
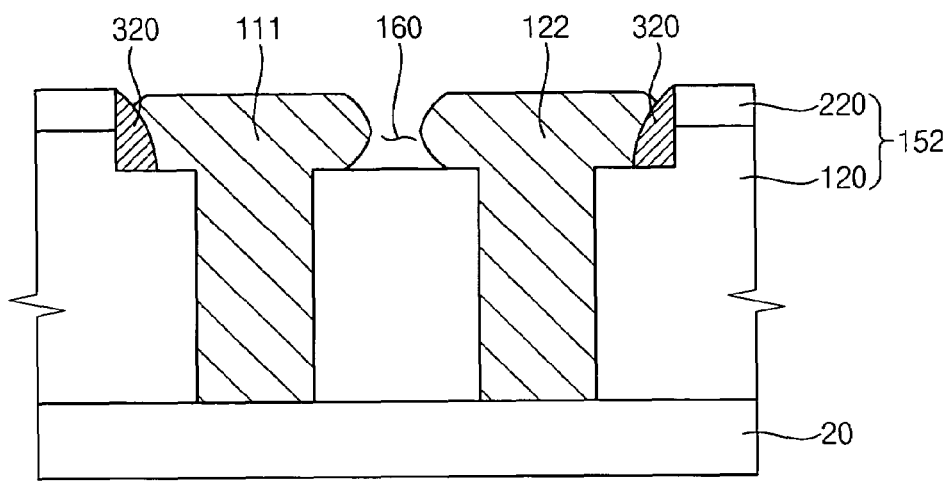

Referring to FIG. 21, the first and second preliminary single crystal members 111a and 122a are epitaxially grown to form the first and second single crystal members 111 and 122.

The first and second single crystal members 111 and 122 may contact the filling member 320. The first and second single crystal members 111 and 122 may continuously fill up the first opening 11, and the second opening 12.

The first and second single crystal members 111 and 122 may be formed using a silicon source gas. Examples of the silicon source gas may include silicon tetrachloride, silane, dichlorosilane, trichlorosilane, etc. These may be used alone or in a mixture thereof.

If the temperature at which the first and second single crystal members 111 and 122 are formed is under about 750° C., the epitaxial growth rate of the first and second single crystal members 111 and 122 may be low. If the temperature is over about 1,250° C., the epitaxial growth rate may be uncontrollable.

Thus, the first and second single crystal members 111 and 122 may be formed at a temperature between about 750° C. and about 1,250° C. Preferably, the first and second single crystal members 111 and 122 may be formed at a temperature between about 800° C. and about 900° C.

The first single crystal member 111 may be spaced apart from the second single crystal member 122.

In particular, a time during which the first and second single crystal members 111 and 122 are epitaxially grown may be precisely controlled with consideration of an epitaxial growth rate of the first and second single crystal members 111 and 122, so that the first and second single crystal members 111 and 122 may be spaced apart from each other by a gap 160.

Figure 22:
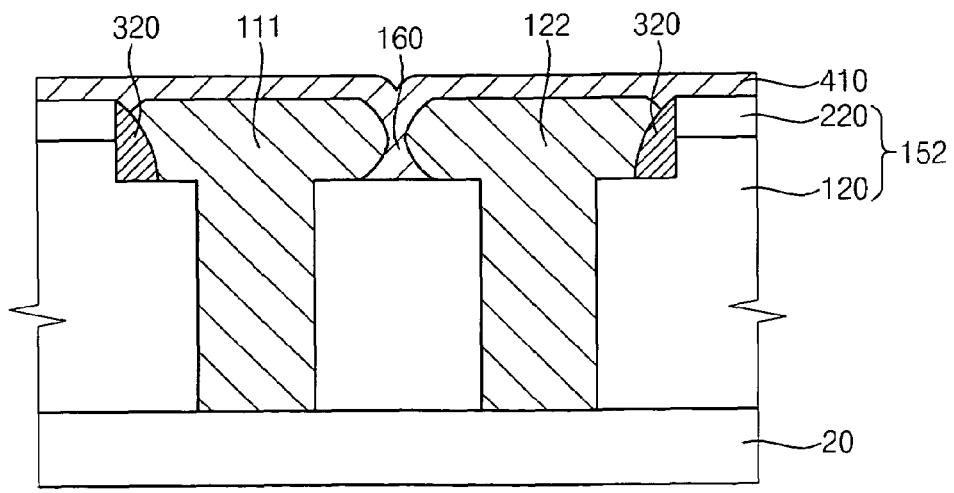

Referring to FIG. 22, an amorphous layer 410 is formed on the first insulation member 152, the filling member 320, the first single crystal member 111 and the second single crystal member 122. The amorphous layer 410 may fill the gap 160 between the first single crystal member 111 and the second single crystal member 122.

The amorphous layer 410 may include the same material as in the first and second single crystal members 111 and 122. That is, the amorphous layer 410 may include silicon.

The amorphous layer 410 may be formed using a silicon source gas. The silicon source gas may include silicon tetrachloride, silane, dichlorosilane or trichlorosilane. These may be used alone or in a mixture thereof.

If the temperature at which the amorphous layer 410 is formed is under about 400° C., silicon atoms may not be efficiently dissociated from the silicon source gas. If the temperature is over about 600° C., an epitaxial rate of the first and second single crystal members 111 and 122 that may additionally grow during formation of the amorphous layer 410 may increase.

Thus, the amorphous layer 410 may be formed at a temperature between about 400° C. and about 600° C. Preferably, the amorphous layer 410 may be formed at a temperature between about 530° C. and about 540° C.

As described above, some epitaxial growth of the first and second single crystal members 111 and 122 may occur while the amorphous layer 410 is being formed. However, the deposition rate of the amorphous layer 410 may be about twice as fast as the epitaxial growth rate of the first and second single crystal members 111 and 122. Thus, the amorphous layer 410 may fully fill the gap 160 between the first and second single crystal members 111 and 122 before the first and second single crystal members 111 and 122 make contact with each other due to epitaxial growth thereof.

However, if the first and second single crystal members 111 and 122 are grown epitaxially by a substantial amount, the first and second single crystal members 111 and 122 may contact each other. Thus, the amorphous layer 410 may not completely fill the gap 160 between the first and second single crystal members 111 and 122, which may result in the formation of voids between the first and second single crystal members 111 and 122.

As a result, it is preferable that the silicon source gas is supplied toward a portion of the insulation member 152 exposed between the first and second single crystal members 111 and 122.

A nitrogen ($N_2$) gas may be supplied with the silicon source gas. A flow rate of the nitrogen gas may be adjusted to substantially limit silicon atoms that are separated from the silicon source gas from being diffused into the insulation member 152 and the first and second single crystal members 111 and 122.

Thus, the flow rate of the nitrogen gas may no more than that of the silicon source gas.

Figure 23:
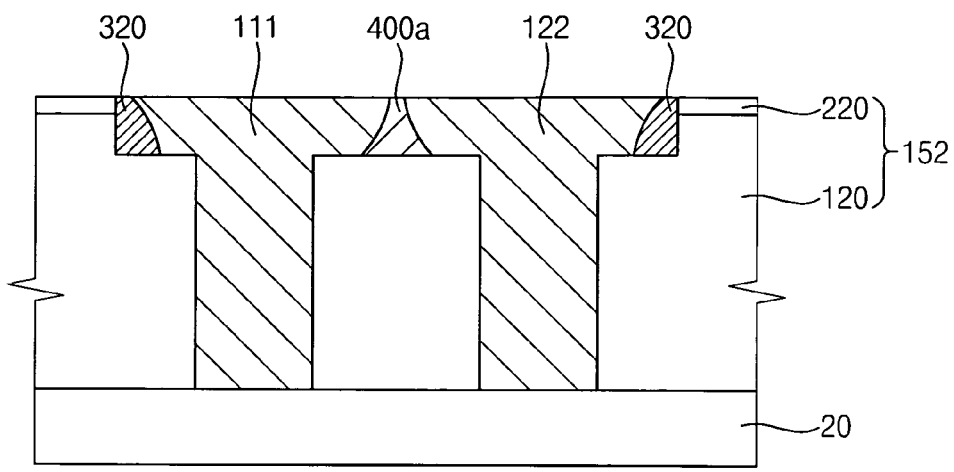

Referring to FIG. 23, the amorphous layer 410 may be planarized until the insulation member 152, the first single crystal member 111 and the second single crystal member 122 are exposed to form an amorphous connection member 400a.

The amorphous layer 410 may be planarized, for example, by a chemical mechanical polishing process and/or an etch-back process. These may be used alone or in a combination thereof.

Figure 24:
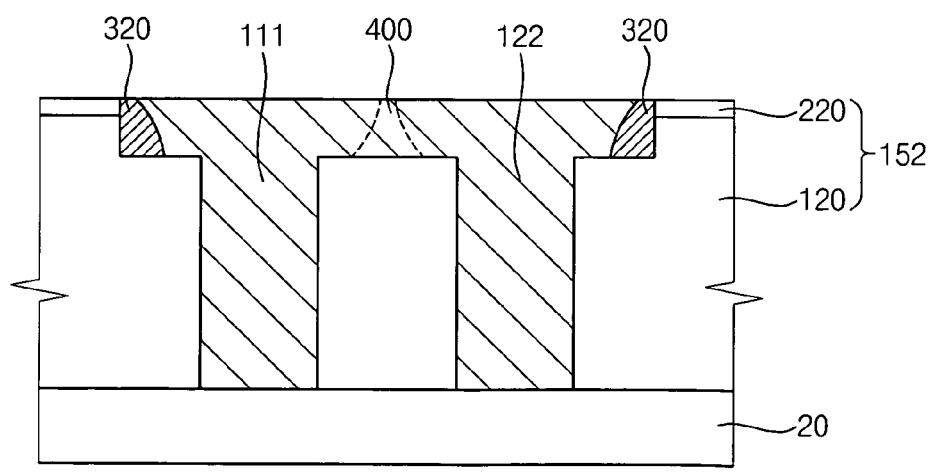

Referring to FIG. 24, the amorphous connection member 400a having an amorphous state is thermally treated to form a single crystal connection member 400 having a single crystalline state. The single crystal connection member 400 is connected between the first and second single crystal members 111 and 122.

The single crystal connection member 400 is formed by using the first and second single crystal members 111 and 122 together as a seed. Thus, there may be substantially no physical interfaces between the first single crystal member 111 and the single crystal connection member 400, and/or between the second single crystal member 122 and the single crystal connection member 400.

If the amorphous connection member 400a is thermally treated at a temperature under about 570° C., the connection member 400a may not change into a single crystalline state. If the amorphous connection member 400a is thermally treated at a temperature over about 650° C., a thermal process required for thermally treating the amorphous connection member 400a may be uncontrollable.

Thus, the amorphous connection member 400a may be thermally treated at a temperature between about 570° C. and about 650° C. Preferably, the amorphous connection member 400a may be thermally treated at a temperature between about 600° C. and about 620° C.

Although it is not illustrated in the drawings, semiconductor structures, such as a gate electrode and/or a metal wire, may be formed on the first single crystal member 111, the second single crystal member 122, and the single crystal connection member 400.

In addition, processes illustrated In FIGS. 13 to 24 may be repeatedly performed to stack at least two dual damascene channel structures 2000.

According to some embodiments of the present invention, a filling member may be formed between a single crystal member that is epitaxially grown, and an insulation member. Thus, formation of voids between the single crystal member and the insulation member may be reduced.

In addition, a single crystal connection member may be formed between single crystal members. Thus, formation of voids between the single crystal members may be reduced.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of embodiments of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a dual damascene structure, the method comprising:

forming a preliminary dual damascene structure comprising an insulation member and preliminary single crystal members, the insulation member formed on a single crystal seed layer, the insulation member comprising a plurality of first openings and a second opening, the first openings partially exposing the single crystal seed layer, the second opening being communicated with the first openings, the second opening being substantially wider than the first openings, the preliminary single crystal members making contact with the single crystal seed layer, the preliminary single crystal members substantially filling up the first openings;

forming a filling member on a side face of the second opening, the filling member partially filling up the second opening;

forming single crystal members by causing the preliminary single crystal members to grow epitaxially, the single crystal members making contact with the filling member, the single crystal members continuously filling up the first openings and a part of the second opening; and forming a connection member between the single crystal members, the connection member having an amorphous state; and changing the state of the connection member from an amorphous state to a single crystal state to thereby form a single crystal connection member connected between the single crystal members.

2. The method of claim 1, wherein the single crystal seed layer comprises silicon.

3. The method of claim 1, wherein the insulation member comprises an oxide.

4. The method of claim 1, wherein the preliminary single crystal members comprise the same material as the single crystal seed layer.

5. The method of claim 1, wherein forming the preliminary dual damascene structure comprises;

forming a first preliminary insulation layer pattern on the single crystal seed layer, the first preliminary insulation layer pattern having the first openings that partially expose the single crystal seed layer;

forming preliminary epitaxial members by causing the single crystal seed layer to grow epitaxially, the preliminary epitaxial members filling up the first openings, the preliminary epitaxial members having protrusions positioned over the first preliminary insulation layer pattern;

forming epitaxial members by removing the protrusions of the preliminary epitaxial members;

forming a second insulation layer on the first preliminary insulation layer pattern and the epitaxial members;

forming first and second insulation layer patterns by partially removing the first preliminary insulation layer pattern and the second insulation layer until portions of the epitaxial members are partially protruded; and forming preliminary single crystal members by removing the protrusions of the epitaxial members.

6. The method of claim 5, wherein the preliminary epitaxial members are formed using a silicon source gas at a temperature between about 750° C. and about 1,250° C.

7. The method of claim 6, wherein the silicon source gas comprises silicon tetrachloride, silane, dichlorosilane and/or trichlorosilane.

8. The method of claim 5, wherein the epitaxial members are formed by a chemical mechanical polishing process, an etch-back process or a combination thereof.

9. The method of claim 5, wherein the preliminary single crystal members are formed by a dry etching process.

10. The method of claim 1, wherein the filling member comprises a nitride.

11. The method of claim 1, wherein forming the filling member comprises:

forming an insulation layer on the preliminary dual damascene structure; and anisotropically etching the insulation layer.

12. The method of claim 1, wherein the single crystal members are formed using a silicon source gas at a temperature between about 750° C. and about 1,250° C.

13. The method of claim 12, wherein the silicon source gas comprises silicon tetrachloride, silane, dichlorosilane and/or trichlorosilane.

14. The method of claim 13, wherein forming the connection member further comprises using a nitrogen gas.

15. The method of claim 14, wherein a flow rate of the nitrogen gas is substantially smaller than that of the silicon source gas.

16. The method of claim 13, wherein the connection member is formed by a chemical mechanical polishing process, an etch-back process or a combination thereof.

17. The method of claim 13, wherein the connection member is thermally treated at a temperature between about 570° C. and about 650° C.

18. The method of claim 1, wherein the single crystal connection member comprises a same material as in the single crystal members.

19. The method of claim 1, wherein forming the single crystal connection member comprises;

forming an amorphous layer on the insulation member, the filling member and the single crystal members, the amorphous layer being connected between the single crystal members;

planarizing the amorphous layer until the insulation member and the single crystal members are exposed to form an amorphous connection member connected between the single crystal members, the amorphous connection member being in an amorphous state; and thermally treating the amorphous connection member to change the amorphous state into a single crystalline state.

20. The method of claim 19, wherein the amorphous layer is formed using a silicon source gas at a temperature between about 400° C. and about 600° C.

21. The method of claim 20, wherein the silicon source gas comprises silicon tetrachloride, silane, dichlorosilane and/or trichlorosilane.

* * * * *